United States Patent
Vassal et al.

(10) Patent No.: US 11,681,893 B2
(45) Date of Patent: Jun. 20, 2023

(54) DEVICE FOR CONNECTING A SMART CARD TO A TEXTILE AND METHOD FOR MANUFACTURING ELECTRONIC CARDS IN A FLEXIBLE SMART CARD FORMAT

(71) Applicant: LINXENS HOLDING, Mantes la Jolie (FR)

(72) Inventors: Simon Vassal, Clichy (FR); Christophe Mathieu, Mantes la Jolie (FR)

(73) Assignee: LINXENS HOLDING, Mantes la Jolie (FR)

( * ) Notice: Subject to any disclaimer, the term of this patent is extended or adjusted under 35 U.S.C. 154(b) by 39 days.

(21) Appl. No.: 17/624,698

(22) PCT Filed: Jun. 12, 2020

(86) PCT No.: PCT/HR2020/051008
§ 371 (c)(1),
(2) Date: Jan. 4, 2022

(87) PCT Pub. No.: WO2021/005278
PCT Pub. Date: Jan. 14, 2021

(65) Prior Publication Data
US 2022/0253664 A1    Aug. 11, 2022

(30) Foreign Application Priority Data
Jul. 5, 2019    (FR) ....................... 1907533

(51) Int. Cl.
G06K 19/077    (2006.01)
(52) U.S. Cl.
CPC ............. *G06K 19/07762* (2013.01)

(58) Field of Classification Search
None
See application file for complete search history.

(56) References Cited

U.S. PATENT DOCUMENTS

2018/0338554 A1    11/2018  Huang et al.

FOREIGN PATENT DOCUMENTS

| DE | 102011005606 | 3/2012 |
| EP | 1489696 | 12/2004 |

(Continued)

OTHER PUBLICATIONS

International search report for PCT/FR2020/051008 dated Sep. 11, 2020.

*Primary Examiner* — Kristy A Haupt
(74) *Attorney, Agent, or Firm* — Perman & Green, LLP (57) ABSTRACT

Disclosed is an electronic card, in the form of a flexible smart card provided with a flexible circuit, that includes a bottom face receiving electronic components and a top face provided with contact tabs intended to be connected to conductive tracks of a garment textile. The flexible circuit being covered on its bottom face with at least one bottom layer of bonding adhesive, first polymer layers provided with cutouts for receiving components and second polymer layers for encapsulating the components, and covered on its top face with a top layer of bonding adhesive and at least one top layer forming an outer face of the card made from polymer material provided with cutouts for accessing the contact tabs, in which at least some of the contact tabs are produced on the rim of the card and provided with an end part on the edge of the card.

15 Claims, 5 Drawing Sheets

(56) References Cited

FOREIGN PATENT DOCUMENTS

| EP | 2937823 | 10/2015 | |
|----|---------|---------|---|
| KR | 20080114107 | 12/2008 | |
| WO | 03028044 | 4/2003 | |
| WO | WO-03028044 A2 * | 4/2003 | ....... G06K 19/07743 |
| WO | 2014096140 | 6/2014 | |
| WO | 2016122317 | 8/2016 | |
| WO | WO-2016122317 A1 * | 8/2016 | ............. H01R 12/77 |

* cited by examiner

DEVICE FOR CONNECTING A SMART CARD TO A TEXTILE AND METHOD FOR MANUFACTURING ELECTRONIC CARDS IN A FLEXIBLE SMART CARD FORMAT

CROSS-REFERENCE TO RELATED APPLICATIONS

This application is a National Stage of International Application No. PCT/FR2020/051008, having an International Filing Date of 12 Jun. 2020, which designated the United States of America, and which International Application was published under PCT Article 21(2) as WO Publication No. 2021/005278 A1, which claims priority from and the benefit of French Patent Application No. 1907533, filed on 5 Jul. 2019, the disclosures of which are incorporated herein by reference in their entireties.

BACKGROUND

Field

The present disclosure relates to the connection between a card of chip card type and conductive tracks of a "smart" garment.

A smart garment is a garment that is equipped with electronic devices such as biological or physiological sensors, heating means or other electronic devices that are integrated into the garment.

In the case of biological or physiological sensors recording body parameters, it may be necessary to have a removable electronic measurement device which connects to electrical connections from the sensors of the garment to carry out monitoring or recording and may be removed from the garment, for example in order to collect measurement data, and easily put back into position, for example in order to resume monitoring.

BRIEF DESCRIPTION OF RELATED DEVELOPMENTS

It is known practice, in order to record biometric data, to connect body sensors to measurement units that are equipped with printed circuit boards bearing electronic components. However, such devices are uncomfortable to wear because clothes are flexible and stretchable while the units and printed circuit boards are rigid. Furthermore, they must be connected to the sensors via connecting cables and rigid connectors.

It is also known practice to use press studs to connect physiological sensors of a garment to a measurement or storage device.

SUMMARY

In view of this prior art, an improvement in the connection of sensors of a smart garment to an electronic measurement device and miniaturization of such a measurement device are sought and the present patent application relates, in this context, to an electronic card that is produced in a format such as a credit card format and, in particular, in a flexible chip card format, which is provided with at least one flexible circuit comprising a first face accommodating electronic components and a second face that is provided with contact tabs that are intended to be connected to conductive tracks of a clothing textile, said flexible circuit being covered, on its first face, with first polymer layers for encapsulating the components and covered, on its second face, with at least one first layer of polymer material for producing an outer face of the card which is provided with cutouts for accessing the contact tabs, wherein at least some of the contact tabs are produced at the edge of the card and provided with a terminal portion on the edge face of the card.

This configuration makes it possible to enhance the contact with connection tracks in the fabric of the garment because, in addition to the exposed faces of the contact tabs, the one or more edges of the card that are equipped with terminal portions of the contact tabs on their edge press into the fabric that is applied to the card and produce a contact region with a contact pressure.

The second face of the flexible circuit may comprise, at a distance from the edges of the card, contact pads for connecting to a chip card reader. The card may also comprise an antenna, such as an RFID antenna, or a radio circuit for a connection such as a Bluetooth or Wi-Fi connection, for example.

The flexibility of the flexible circuit and the thickness of said first layer of polymer material for producing an outer face of the card are chosen such that said contact tabs are flush with the surface of the card after the card has been laminated.

Thus, during lamination, the flexible circuit portions at the cutouts in the upper layer of polymer material are pushed into these cutouts and the surface of the tabs and optionally of the pads become flush with the upper surface of the card, thereby improving the outer connections to the card.

According to a first aspect, the terminal portions of the contact tabs on the edge face of the card are level with the plane of the edge face of the card.

These terminal portions may comprise a sharp or rounded edge, may be portions of the tabs that are rounded or curved and may also be cantilevered over the edge face of the card.

When the card comprises a flexible circuit on one side only, the first polymer layers for encapsulating the components may be covered by at least one layer of protective polymer and by a second layer of polymer material for producing an outer face of the card.

Intermediate layers may also be inserted to guarantee a given thickness to the card.

According to one particular aspect, the card comprises two flexible circuits that are provided with contact tabs that are produced at the edge of the card, each flexible circuit being arranged under an outer face of the card in order to have contact tabs on both faces of the card.

In this case, the flexible circuits are advantageously separated by polymer layers for encapsulating the components.

Connections may then be made on both faces of the card to tracks of the garment.

For manufacturing the card, one or more layers of adhesive may be interposed between the flexible circuit and the polymer layers.

The patent application further relates to a method for manufacturing a card according to the disclosure which comprises:

a. producing at least one flexible circuit blank that is provided with lateral handling perforations on two opposite edges, with connection tracks on a first face and on a second face of said blank, and is further provided, on its second face, with contact tabs that are aligned along at least one of said edges and close to said edge;

b. depositing electronic components that are connected to at least some of the connection tracks of a first face of the flexible circuit by soldering, brazing, flip chip, SMD or wire bonding on said first face of said flexible circuit blank;

c. producing a stack of layers around the flexible circuit blank such that the stack comprises at least first polymer layers for encapsulating the components on the first face of the flexible circuit blank and comprises at least one second polymer layer for producing an outer face of the card on the second face of the flexible circuit blank, said at least one second polymer layer being provided with cutouts for accessing said contact tabs;

d. hot or cold rolling the assembly of sheets and said at least one flexible circuit blank, e. cutting out the card from the assembly of laminated layers, the position where the card is cut out with respect to said edge being fixed such that cutting out said card leaves some of the tabs exposed on the edge face of the card.

The stack may further comprise, before lamination, a protective polymer layer and a second layer of polymer material for forming a second face of the card on the first polymer layers for encapsulating the components.

With the card comprising two flexible circuits, the method may further comprise, before lamination:

a. depositing, on the first layers for encapsulating the components, second layers for encapsulating components of a second flexible circuit;

b. depositing the first face of the second flexible circuit on said second layers;

c. depositing, on the second face of the second flexible circuit, a second layer of polymer material for forming a second face of the card.

The card may be cut out flush with the end of the tabs or shear off a portion of the tabs.

Advantageously, the card is cut out by means of a punch/die device.

According to one particular aspect, the method may comprise one or more steps of applying adhesive between one or more faces of the flexible circuit and one or more polymer layers.

BRIEF DESCRIPTION OF THE DRAWINGS

Other features, details and advantages will become apparent on reading the detailed description below, and study of the appended drawings, in which.

DETAILED DESCRIPTION

The drawings and the description below contain, for the most part, elements of a determinate nature. They may therefore not only serve to make the present disclosure better understood, but also contribute to defining it, where applicable.

Figure 1:
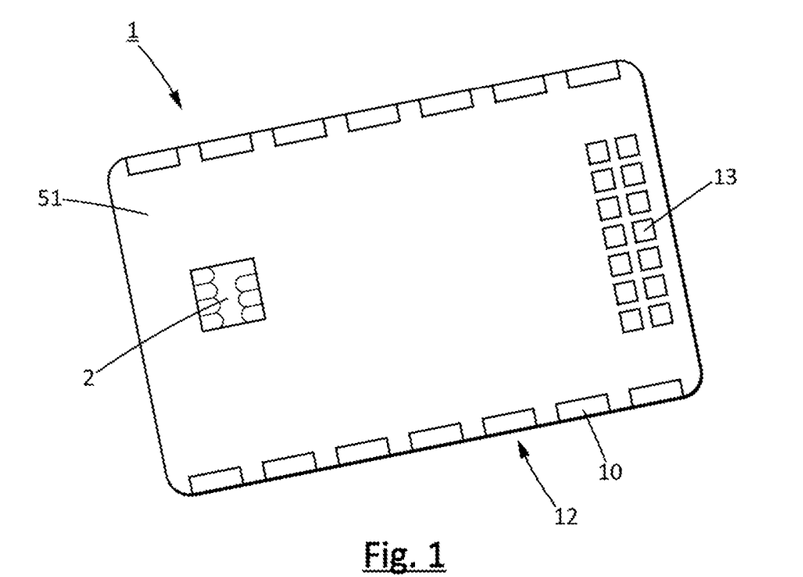
FIG. 1 shows an example of an electronic card of the present patent application.

The present patent application relates to an electronic card in the form of a flexible card 1 in a chip card or credit card type format as shown in FIG. 1. The electronic card comprises contact tabs 10 that are intended to be connected to conductive tracks of a clothing textile, and that are aligned on two opposite edges of the card, and an upper face 51 for producing an outer face of the card that is equipped with cutouts leaving the tabs visible on the top of the card. It further comprises, according to the example shown and optionally, contact pads 2 for contact with a standard chip card reader and optionally pads 13 for connecting to a testing or programming tool.

In other aspects, the contact pads may be replaced or supplemented by an antenna such as an RFID antenna or a radio antenna such as a Bluetooth or Wi-Fi antenna that is produced on the flexible circuit.

Figure 5:
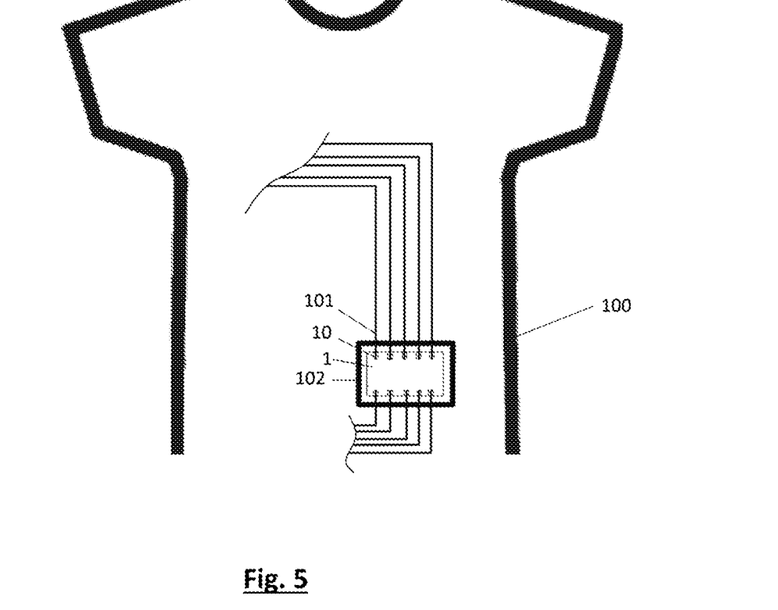
FIG. 5 shows a schematic view of a card of the patent application embedded in a garment.

One example of an application of the card is shown schematically in FIG. 5, wherein the conductive tracks 101 of a smart garment 100 have terminations, for example in a pocket 102 or a compartment of the garment accommodating the card 1, and wherein these conductive tracks are brought into contact with the contact tabs 10.

Figure 2:
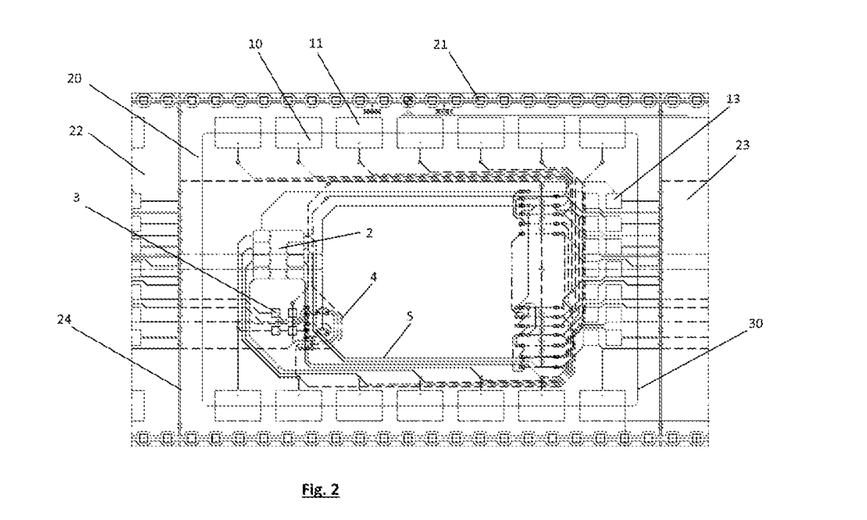
FIG. 2 shows a transparent top view of an example of a flexible circuit blank relating to the present patent application.
Figure 3:
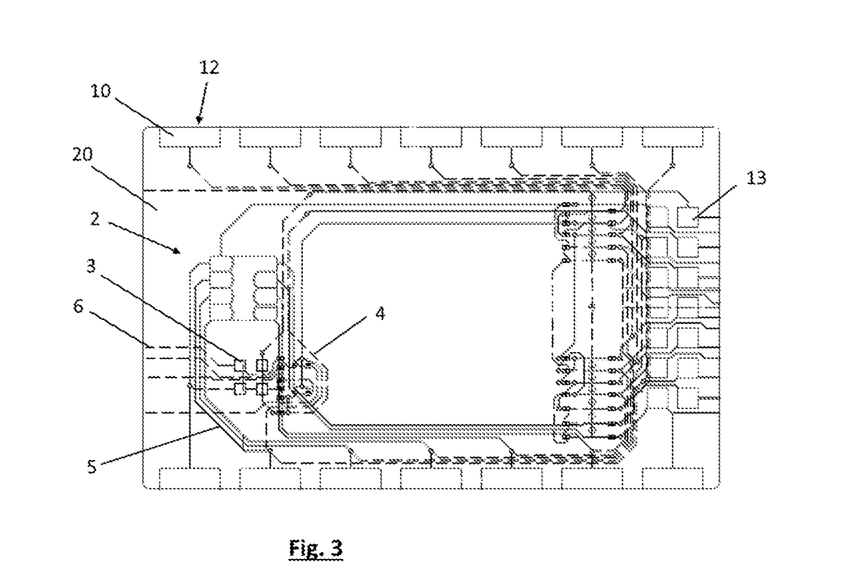
FIG. 3 shows a transparent top view of the flexible circuit derived from the blank of FIG. 2.

The electronic card is provided with a flexible circuit 20 which is shown in several cutting steps in FIGS. 2 and 3. This flexible circuit includes a lower face accommodating electronic components 3a, 3b on connection pads 3 that are connected to conductive tracks 4 and an upper face that is provided with the contact tabs 10. It includes, conventionally, connection tracks 5 which connect the various components and connection points of the flexible circuit to the tracks 4. The substrate of the flexible circuit may be produced using a material such as polyimide (PI), a glass epoxy composite, polyethylene terephthalate (PET), polyethylene naphthalate (PEN), industrial paper or other suitable material.

By convention, the face of the card includes the contact pads and tabs will be referred to as the upper face and the face of the card that is devoid of contact means as the lower face in the case of a card with contacts on only one face.

Figure 6:
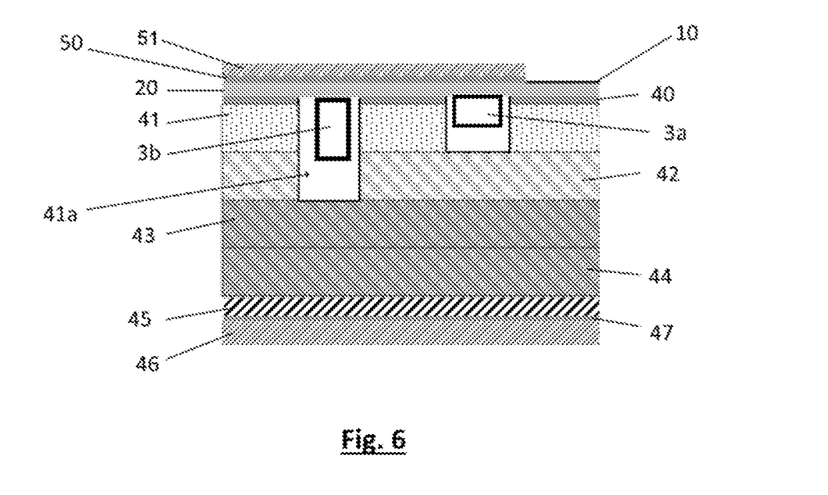
FIG. 6 shows a cross-sectional detail of a card of the patent application comprising a flexible circuit.

According to FIG. 6, the flexible circuit is covered, on its lower face, on the one hand, with at least one lower layer 40 of bonding adhesive, in particular a polyurethane adhesive, and with first polymer layers 41, 42, for example one or more layers that are provided with cutouts 41a for accommodating the components 3a, 3b and, on the other hand, with second, protective polymer layers 43, 44, the assembly of these layers encapsulating the components 3a, 3b.

The protective layers may be one or more additional PVC layers 43, 44 which further make it possible to increase the thickness of the card if necessary. Under the encapsulation layers is a covering layer 45 and a PET layer for forming an outer face of the card 46. This layer forms an appearance layer which is, according to the example, bonded under the protective layer to a layer of adhesive 47 such as a polyurethane adhesive.

Still according to FIG. 6, the flexible circuit is covered, on its upper face, with an upper layer 50 of polyurethane bonding adhesive and with at least one upper layer 51 for producing an outer face of the card from polymer material such as a PET. The layer of adhesive and the upper layer are provided with cutouts for accessing the contact tabs 10.

It should be noted that the thickness of the contact tabs may be less than the sum of the thicknesses of the layer of adhesive and of the upper layer of polymer material because the manufacturing method comprises a step of laminating the card which will bind the layers together and, in this case, push the flexible circuit into the openings in the upper layer such that the tabs are flush with the upper surface of the card.

Figure 4A:
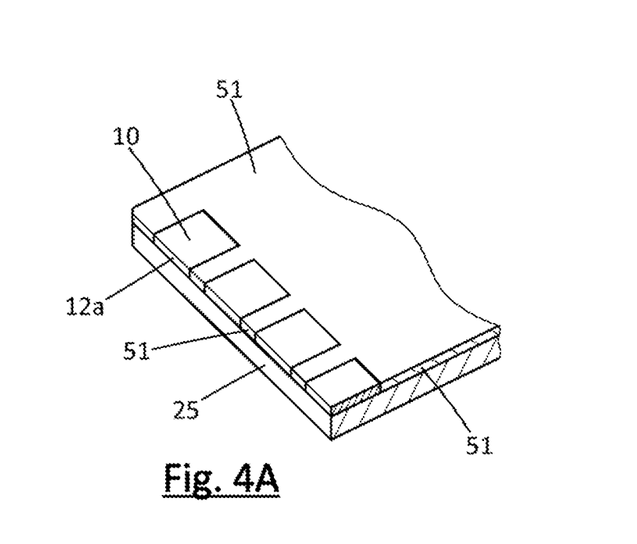
FIG. 4A, FIG. 4B and FIG. 4C show variant aspects according to the present patent application.
Figure 4B:
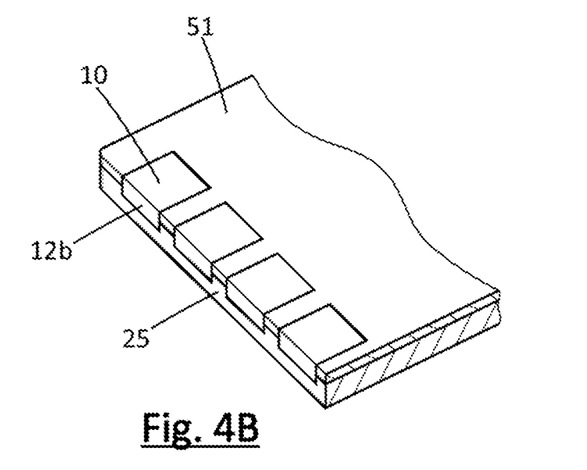
Figure 4C:
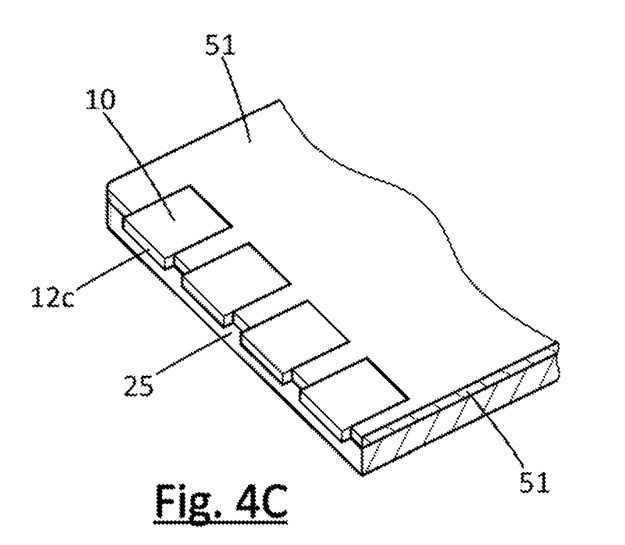

According to the present patent application and as shown, for example, in FIGS. 4A to 4C, a plurality of contact tabs is produced at the edge of the card and these tabs are provided with a terminal portion 12a, 12b, 12c on the edge face 25 of the card.

According to FIG. 4A, the terminal portions of the contact tabs 12a on the edge face of the card are level with the plane of the edge face 25 of the card.

In this case, the tabs may have a rounded edge or a sharp edge depending on whether the card is cut out from below or from above, respectively.

It has, however, been determined that cutting producing a rounded edge is more favorable for a reliable connection to the tracks of the garment.

According to FIG. 4B, the terminal portions of the contact tabs on the edge face of the card are portions of tabs 12b that are curved on the edge face 25 of the card.

According to FIG. 4C, the terminal portions of the contact tabs are portions 12c that are cantilevered over the edge face 25 of the card. In this case, the contact tabs retain portions that protrude from the outline of the card when cutting out the outline of the card, for example using a stepped punch/die device.

The method for manufacturing the card firstly comprises producing flexible circuit blanks from a strip which is shown in FIG. 2 and on which a plurality of flexible circuits 20, 22, 23 are etched. These blanks are provided with lateral handling perforations 21 on two opposite edges, with connection tracks 4, 5 on the upper surface and on the lower surface and are provided with contact tabs 10 that are aligned along at least one of said opposite edges and close to said edge.

The electronic components are positioned on connection pads 3 on the lower face of the flexible circuits. These components are connected to the connection tracks 4 of the lower face by any known technique such as soldering, brazing, flip chip, SMD or wire bonding.

Once the flexible circuits in a strip have been fitted with their components, the flexible circuit blanks are separated by cutting the circuits at the lines 24.

In a subsequent step, a stack of layers is produced in order to produce the one or more cards. A plurality of flexible circuit blanks are preferably arranged together on the same rectangular assembly of polymer sheets with, for example, circuits that are arranged in rows and in columns on the sheets. For example, panels of 24 circuits in 6 rows and 4 columns or more are produced.

Production may begin with producing a stack of polymer sheets starting, for example, from a lower face of the card and beginning with a polymer outer layer 46, then optionally a layer of adhesive 47 and a protective layer 45, then an assembly of polymer layers for encapsulating the components, here comprising polymer layers 41, 42 that are provided with cutouts for the components to pass through, and closing layers 43, 44, and depositing, on this assembly, the first face of the one or more flexible circuit blanks. A layer of adhesive 40 may, in certain cases, be interposed between the flexible circuit blanks and the polymer layers.

In this case, on the upper face of the flexible circuits, there is deposited a sheet of a polymer layer 51 for producing an outer face of the card which is provided with cutouts leaving the contact tabs 10 visible. A layer of adhesive 50 may also be provided between the upper face of the flexible circuit and the sheet forming the polymer layer.

The assembly of layers is shown in this order in a cross-sectional side view in FIG. 6, but the method may begin with the outer upper layer 51, the successive depositions being carried out in the reverse order.

The assembly is then laminated with pressing and heating to bond the layers. Lamination may, in particular, be carried out in several steps with a pressure ranging from around ten N/cm$^2$ to around one hundred N/cm$^2$ with a temperature ranging up to 160° C. and then a pressure ranging up to approximately 250 N/cm$^2$ at a temperature of the order of room temperature.

It should be noted that, depending on the type of lamination or plastic materials that are used, the application of layers of adhesive may be avoided or required.

As seen above, one advantageous aspect is that, during lamination, the flexible circuit is pushed by the lower layers into the cutouts that are produced in the upper layers and the surface of the tabs and optionally of the pads becomes flush with the upper surface of the card because the flexible circuit portions at the cutouts in the adhesive and in the upper layer of polymer material are pushed into these cutouts. There is thus no need to produce the pads and the tabs with a thickness that is equivalent to the thickness of the upper layer. However, it is preferable for the components under the flexible circuit to be arranged at a distance from these cutouts in order to avoid connection problems when the flexible circuit is pushed.

The cards are then cut out along the final cutting line of the card with a punch/die type device.

According to the present patent application, the position of the tabs with respect to said edge is fixed such that said cutting leaves the end of the tabs exposed on the edge face of the card.

Several aspects of the connection region at the edge of the card are possible.

The cutting may shear off a portion 11 of the tabs 10 along the cutting line 30 of FIG. 2, thereby making it possible to have a greater manufacturing tolerance, thus obtaining a connection region at the edge of the card.

The edge of the card may also be cut out flush with the end of the tabs, thereby minimizing losses of metal constituting the tabs while maintaining a connection region at the edge of the card.

In either case, the edges of the tabs on the card remain in the plane of the edge face of the card or protrude slightly from the edge of the card.

For cutting, the assembly is preferably positioned such that the upper face bearing the contact tabs rests against the die and the punch is preferably applied to the lower face on the components and encapsulation layers, thereby giving terminal portions or rounded edges at the ends of the tabs at the edge of the card.

In the event that the punch is applied on the upper side, the edges of the tabs are sharp edges.

The electronic cards that are produced according to the present patent application ensure an effective connection to the conductors or conductive tracks 101 of the garment and may be easily inserted into and removed from the pockets or compartments 102 accommodating them, contact between the tabs 10 and the tracks 101 of the garment being established or re-established when inserting or reinserting the cards into the pockets.

An alternative aspect provides cards comprising tabs on both of their faces. In this case, the stack corresponds to the example of FIG. 7 and is symmetrical with respect to a median plane in order to comprise, from the bottom to the top of the figure, an outer layer 51 and a layer of adhesive 50 provided with cutouts for accessing the tabs 10, the first flexible circuit 20 with its tabs 10 facing downwards, a second layer of adhesive 40, the layers 41, 42 provided with cutouts for the components 3a of the first flexible circuit to pass through, and optionally one or more layers closing the passages for components (these are not shown), the layers 42', 41' provided with cutouts for the components 3'a, 3'b of the second flexible circuit to pass through, a third layer of adhesive 40' on which the second flexible circuit 20' is positioned, a fourth layer of adhesive 50' and the second outer layer 51', these two last layers being provided with cutouts in order to let the tabs 10' pass through.

Figure 7:
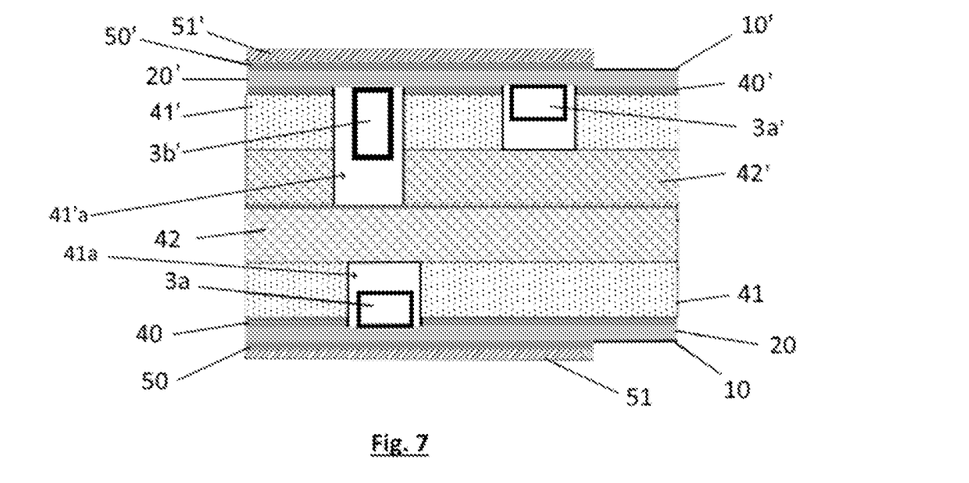
FIG. 7 shows a cross-sectional detail of a card of the patent application comprising two flexible circuits.

In this aspect, the lamination will make it possible for the assembly of layers to be bonded and for the contact tabs to be pushed into the cutouts in the two faces.

The disclosure is not limited to the examples shown and, in particular, the number of tabs may be modified and the number of layers, such as the protective layers 43, 44 supplementing the encapsulation of the components, may be adjusted according to the desired thickness for the card.

What is claimed is:

1. An electronic card, produced in a format such as a credit card format and, in particular, in a flexible chip card format, provided with at least one flexible circuit comprising a first face accommodating electronic components and a second face that is provided with contact tabs that are intended to be connected to conductive tracks of a clothing textile, wherein said flexible circuit is covered, on its first face, with first polymer layers for encapsulating the components and covered, on its second face, with at least one first layer of polymer material for producing an outer face of the card which is provided with cutouts for accessing said contact tabs, wherein at least some of said contact tabs are produced at an edge of the card and provided with a terminal portion on an edge face of the card.

2. The electronic card as claimed in claim 1, wherein the second face of the flexible circuit comprises, at a distance from the edges of the card, contact pads for connecting said card to a chip card reader.

3. The electronic card as claimed in claim 1, wherein, with said card being a laminated card, said contact tabs are flush with the surface of the card after lamination.

4. The electronic card as claimed in claim 1, wherein terminal portions of said contact tabs on an edge face of the card are level with the plane of said edge face of the card and comprise a sharp or rounded edge.

5. The electronic card as claimed in claim 1, wherein end portions of the contact tabs on the edge face of the card are portions of said tabs that are rounded or curved, or portions of said tabs that are cantilevered over said edge face of the card.

6. The electronic card as claimed in claim 1, wherein said first polymer layers for encapsulating said components are covered by at least one layer of protective polymer material and a second layer of polymer material for producing an outer face of the card.

7. The electronic card as claimed in claim 1, comprising two flexible circuits each comprising several of said contact tabs located at the edge of the card, each flexible circuit being arranged under an outer face of the card, said flexible circuits being separated by polymer layers for encapsulating the components.

8. The electronic card as claimed in claim 1, wherein one or more layers of adhesive are interposed between the flexible circuit and the polymer layers.

9. A method for manufacturing electronic cards in a flexible chip card format, comprising:
   a. producing at least one flexible circuit blank that is provided with lateral handling perforations on two opposite edges, with connection tracks on a first face and on a second face of said blank, and is further provided, on its second face, with contact tabs that are aligned along at least one of said edges and close to said edge;
   b. depositing electronic components connected to at least some of said connection tracks of a first face of the flexible circuit by soldering, brazing, flip chip, SMD or wire bonding on said first face of said flexible circuit blank;
   c. producing a stack of layers around the flexible circuit blank such that the stack comprises at least first polymer layers for encapsulating the components on the first face of the flexible circuit blank and comprises at least one second polymer layer for producing an outer face of the card on the second face of the flexible circuit blank, said at least one second polymer layer being provided with cutouts for accessing said contact tabs;
   d. hot or cold rolling the assembly of sheets and said at least one flexible circuit blank,
   e. cutting out the card from the assembly of laminated layers,
and wherein the position where the card is cut out with respect to said edge is fixed such that cutting out the card leaves some of said tabs exposed on the edge face of the card.

10. The method as claimed in claim 9, wherein the stack further comprises, before lamination, a protective polymer layer, a second layer of polymer material for forming a second face of the card on the first polymer layers for encapsulating the components.

11. The method as claimed in claim 9, wherein, with the card comprising two flexible circuits, the method further comprises, before lamination:
   a. depositing, on the first layers for encapsulating the components, second layers for encapsulating components of a second flexible circuit;
   b. depositing the first face of the second flexible circuit on said second layers;
   c. depositing, on the second face of the second flexible circuit, a second layer of polymer material for forming a second face of the card.

12. The method as claimed in claim 9, wherein the card is cut out flush with the end of the tabs.

13. The method as claimed in claim 9, wherein cutting out the card shears off a portion of the tabs.

14. The method as claimed in claim 9, wherein the card is cut out by means of a punch/die device.

15. The method as claimed in claim 9, comprising one or more steps of applying adhesive between one or more faces of the flexible circuit and one or more polymer layers.

* * * * *